United States Patent [19]
Chang et al.

[11] Patent Number: 5,343,424
[45] Date of Patent: Aug. 30, 1994

[54] SPLIT-GATE FLASH EEPROM CELL AND ARRAY WITH LOW VOLTAGE ERASURE

[75] Inventors: Chen-Chi P. Chang, Newport Beach; Mei F. Li, Mission Viejo, both of Calif.

[73] Assignee: Hughes Aircraft Company, Los Angeles, Calif.

[21] Appl. No.: 47,134

[22] Filed: Apr. 16, 1993

[51] Int. Cl.⁵ .................... H01L 29/68; G11C 11/34
[52] U.S. Cl. .................... 365/185; 365/182; 365/900; 257/317; 257/314; 257/320; 257/321
[58] Field of Search ............... 365/185, 900, 182, 203; 257/320, 321

[56] References Cited

U.S. PATENT DOCUMENTS

| | | | |
|---|---|---|---|
| 4,783,766 | 11/1988 | Samachisa et al. | 365/900 |
| 4,958,321 | 9/1990 | Chang | 365/900 |
| 5,057,886 | 10/1991 | Riemenschneider et al. | 365/185 |
| 5,168,465 | 12/1992 | Harari | 365/900 |
| 5,194,925 | 3/1993 | Ajika et al. | 365/185 |

OTHER PUBLICATIONS

"A Flash-Erase EEPROM Cell With An Asymmetric Source and Drain Structure", by H. Kume et al., IEDM, 25.8, 1987, pp. 560–563.

"A 128K Flash EEPROM Using Double-Polysilicon Technology", by G. Samacisa et al., IEEE J. Solid-State Circuits, vol. SC-22, No. 5, Oct. 1987, 676–683.

*Primary Examiner*—Viet Q. Nguyen
*Attorney, Agent, or Firm*—Elizabeth E. Leitereg; Terje Gudmestad; W. K. Denson-Low

[57] ABSTRACT

Each unit cell (10) of a flash EEPROM array (50) includes a control gate (38) having a section (38b) disposed in series between a program section (34a) of a floating gate (34) and a source (18) to provide threshold voltage control for erasure. The floating gate (34) further has an erase section (34b) which extends from the program section (34a) around an end of a channel (22) to the source (18). A thin tunnel oxide layer (32) is formed between an end portion (34c) of the erase section (34b) and an underlying portion of the source (18) which enables the floating gate (34) to be erased by Fowler-Nordheim tunneling from the end portion (34c) through the oxide layer (32) to the source (18) with low applied voltages.

14 Claims, 4 Drawing Sheets

SPLIT-GATE FLASH EEPROM CELL AND ARRAY WITH LOW VOLTAGE ERASURE

BACKGROUND OF THE INVENTION

1. Field of the Invention

The present invention generally relates to the art of semiconductor memories, and more specifically to a flash or block erase electrically erasable programmable read-only memory (EEPROM) cell and array which are controllably erasable with low applied voltages.

2. Description Of the Related Art

A flash or block erase EEPROM semiconductor memory includes an array of cells which can be independently programmed and read. The size of each cell and thereby the memory are made small by omitting select transistors which would enable the cells to be erased independently. All of the cells are erased together as a block.

A conventional flash EEPROM is described in an article entitled "A FLASH-ERASE EEPROM CELL WITH AN ASYMMETRIC SOURCE AND DRAIN STRUCTURE", by H. Kume et al, IEDM, 25.8, 1987, pp. 560–563. Each cell includes a source and a drain which are formed on opposite sides of a channel region in a substrate. A thin tunnel oxide layer, a floating gate, a thick gate oxide layer and a control gate are formed over the channel region.

The cell is programmed by applying, typically, 12V to the control gate, 6V to the drain and grounding the source, which causes hot electrons to be injected from the drain depletion region into the floating gate. Upon removal of the programming voltages, the injected electrons are trapped in the floating gate and create a negative charge therein which increases the threshold voltage of the cell to a value in excess of approximately 6V.

The cell is read by applying 5V to the control gate and 1V to the drain, and sensing the impedance of the cell at the source. If the cell is programmed and the threshold voltage (6V) is higher than the control gate voltage (5V), the control gate voltage will be insufficient to enhance the channel and the cell will appear as a high impedance. If the cell is not programmed or erased, the threshold voltage will be low, the control gate voltage will enhance the channel and the cell will appear as a low impedance.

The cell is erased by applying typically 12V to the source, grounding the control gate and allowing the drain to float. This causes the electrons which were injected into the floating gate during programming to be removed by Fowler-Nordheim tunneling from the floating gate through the thin tunnel oxide layer to the source.

A problem with the conventional flash EEPROM cell configuration is that due to manufacturing tolerances, some cells become over-erased before other cells become erased sufficiently. The floating gates of the over-erased cells are depleted of electrons and become positively charged. This causes the over-erased cells to function as depletion mode transistors which cannot be turned off by normal operating voltages applied to their control gates, and introduces leakage during subsequent program and read operations.

A known method of preventing over-erasure is to provide an adaptive erasing algorithm in which the erasing voltages are applied to the control gates as a series of pulses of varying period. This method is complicated and requires additional circuitry for generating the erase pulses in accordance with the algorithm.

The effects of over-erasure can be compensated for by means of a split-gate (also known as stacked- or pass-gate) configuration in which a section of the control gate is disposed in series between the source and the floating gate. The region of the channel which underlies the series section of the control gate can be turned off by the control gate voltage, thereby providing the cell with a stable threshold voltage after erasure and minimizing leakage. A typical split-gate EEPROM is described in an article entitled "A 128K Flash EEPROM Using Double-Polysilicon Technology", by G. Samacisa et al, IEEE J. Solid-State Circuits, Vol. SC-22, No. 5, Oct. 1987, pp. 676–683.

Although achieving stable erasure without the necessity of utilizing an adaptive algorithm, a split-gate EEPROM requires higher applied voltages to achieve erasure than the basic EEPROM. This is because the floating gate is spaced from the source by the series section of the control gate and the intervening gate oxide layer. A higher potential difference is required to accomplish erasure by Fowler-Nordheim tunneling through the thick gate oxide layer of the split-gate EEPROM than through the thin tunnel oxide layer of the basic EEPROM.

SUMMARY OF THE INVENTION

A flash EEPROM cell embodying the present invention achieves the controlled erasure of the split-gate configuration with the low applied voltages of the basic design.

More specifically, a flash EEPROM unit cell of the invention includes a control gate having a section thereof disposed in series between a program section of a floating gate and a source to provide threshold voltage control for erasure. The floating gate further has an erase section which extends from the program section around an end of a channel to the source. A thin tunnel oxide layer is formed between an end portion of the erase section and an underlying portion of the source which enables the floating gate to be erased by Fowler-Nordheim tunneling from the end portion through the oxide layer to the source with low applied voltages.

An array of the present EEPROM cells includes a common elongated source region and a plurality of first and second unit cells which are spaced from each other along and on opposite sides of the source region respectively. The erase sections of the floating gates of the first cells are staggered from those of the second cells parallel to the source region, and may further overlap each other perpendicular to the source region to reduce the array size.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
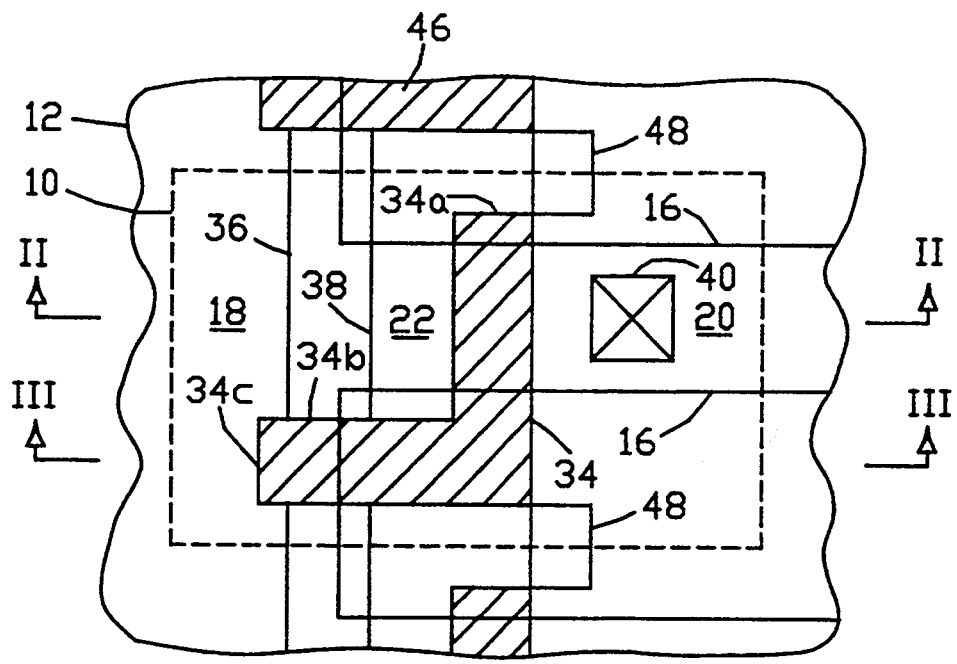
FIG. 1 is a diagram illustrating an EEPROM unit cell embodying the present invention with a floating gate thereof highlighted by diagonal hatching.
Figure 2:
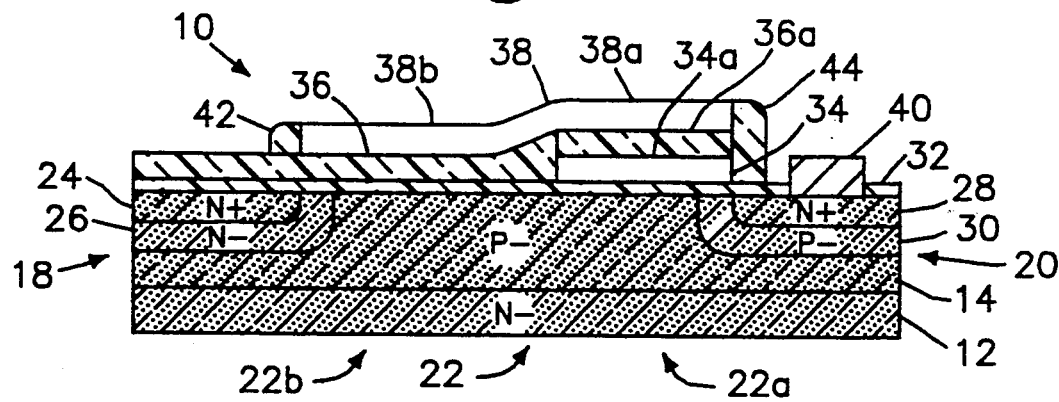
FIG. 2 is a section taken on a line II—II of FIG. 1.
Figure 3:
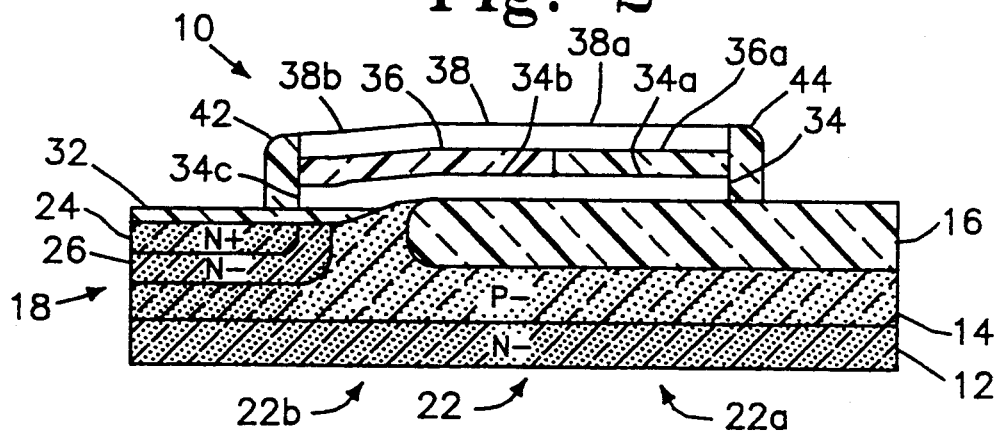
FIG. 3 is a section taken on a line III—III of FIG. 1.

A flash electrically erasable programmable read-only memory (EEPROM) unit cell 10 and portions of adjacent cells of an EEPROM array embodying the present invention are illustrated in FIGS. 1 to 3. The cell 10 is formed in a substrate 12 of N- conductivity type. A lightly doped well 14 of P- conductivity type is formed in the substrate 12. Field oxide insulators 16 insulate the cell 10 from the adjacent cells. It is further within the scope of the invention to provide the substrate 12 of P- conductivity type, in which case the well 14 is unnecessary.

The cell 10 includes a source 18 and a drain 20 which are formed in the well 14, and a channel 22 which is defined in the well 14 between the source 18 and drain 20. As best viewed in FIG. 2, the source 18 includes an N+ ohmic contact strata 24, and an underlying lightly doped N-strata 26 for reducing the electric field in the source depletion region and enabling a higher voltage to be applied to the source 18 for erasing the cell 10.

The drain 20 includes an N+ ohmic contact strata 28, and an underlying shield strata 30 which is doped P, the opposite conductivity type to the strata 28, for increasing the hot electron injection efficiency between the N+ strata 28 and the shield strata 30.

A tunnel oxide layer 32, having a thickness of typically 90–100 angstroms, is formed over the substrate 12. A polysilicon floating gate 34 is formed over the layer 32 and includes a program section 34a and an erase section 34b. The program section 34a overlies a channel programming region 22a, similar to normal flash EEPROM operation. A gap region 22b of the channel 22 is defined between the region 22a and the source 18 for controlling the erase threshold voltage.

As best viewed in FIGS. 1 and 3, the erase section 34b of the floating gate 34 extends around the lower end (as viewed in FIG. 1) of the channel 22, over the field oxide insulator 16 and overlaps the source 18. As illustrated in FIG. 3, the erase section 34b has an end portion 34c which overlies portions of the tunnel oxide layer 32 and the source 18.

A gate oxide layer 36, which typically has a thickness of 550 angstroms, is formed over the gap region 22b of the channel 22 in the source region. A layer 36a, consisting of three sublayers of oxide/nitride/oxide (ONO), is formed over the floating gate 34 for control gate and floating gate isolation. A polysilicon control gate 38 is formed over the gate oxide layer 36 and the ONO layer 36a. A metal drain contact 40 extends through a hole in the oxide layer composed of turnnel oxide 32. Further illustrated in FIGS. 2 and 3 are oxide sidewall spacers 42 and 44 which facilitate the fabrication of the cell 10.

The polysilicon control gate 38 has a "split-gate" configuration, including a first section 38a which overlies the floating gate 34 and the programing region 22a of the channel 22. A second section 38b overlies the gap region 22b of the channel 22 and is disposed in series between the program section 34a of the floating gate 34 and the source 18. The second section 38b acts as a series enhancement mode gate which prevents the cell 10 from functioning as a depletion mode transistor if the floating gate 34 becomes over-erased.

Although the corresponding sections of the channel 22, floating gate 34, control gate 38 are described and illustrated as being the same size and aligned with each other, they may differ in size and/or be offset from each other to an extent which depends on a particular application within the scope of the invention.

The cell 10 is programmed by applying, typically, 12V to the control gate 38, 5–6V to the drain 20 and grounding the source 18. A high electric field is created in the drain depletion region between the drain 20 and the floating gate 34 by the applied voltages which causes impact ionization to occur in this region. Hole-electron pairs are created by the impact of the drain current in the high field region (they hit the silicon atoms). Some of the electrons generated by impact ionization are called "hot electrons".

The control gate voltage causes hot electrons to be injected from the drain depletion region into the floating gate 34 through the program section 34a. These electrons are trapped in the floating gate 34 and create a negative charge therein which increases the threshold voltage of the cell 10.

The cell 10 is read by applying 5V to the control gate 38 and 1–2V to the drain 20, and sensing the impedance of the cell 10 at the source 18. If the cell 10 is programmed and the threshold voltage (>6V) is higher than the control gate voltage (5V), the control gate voltage will be insufficient to enhance the channel 22 and the cell 10 will appear as a high impedance. If the cell 10 is not programmed or erased, the threshold voltage will be low, the control gate voltage will enhance the channel 22 and the cell 10 will appear as a low impedance.

The cell 10 is erased by applying typically 12V to the source 18, grounding the control gate 38 and allowing the drain 20 to float. This causes the electrons which were injected into the floating gate 34 during programming to be removed by Fowler-Nordheim tunneling from the floating gate 34 through the thin tunnel oxide layer 32 to the source 18. Due to the split-gate configuration of the control gate 38, the gap region 22b of the channel 22 which underlies the series section 38b of the control gate 38 can be turned off by a normal control gate voltage, thereby providing the cell 10 with a stable threshold voltage after erasure and minimizing leakage.

In accordance with the invention, erasure is accomplished by Fowler-Nordheim tunneling from the end portion 34c of the erase section 34b of the floating gate 34 through the underlying tunnel oxide layer 32 to the source 18. Erasure can be accomplished with low applied voltages since the tunneling is only required to be performed through the thin oxide layer 32.

In comparison, the conventional split-gate EEPROM configuration requires tunneling for erasure to be performed through the portion of the thick gate oxide layer 36 which overlies the gap region 22b of the channel 22. A much higher potential difference is required to produce Fowler-Nordheim tunneling through the 550 angstrom oxide layer 36 than through the 90 angstrom oxide layer 32. In this manner, the present cell 10 provides the threshold voltage control and over-erasure compensation of a splitgate EEPROM with the low voltage erasure of a basic EEPROM.

Figure 4:
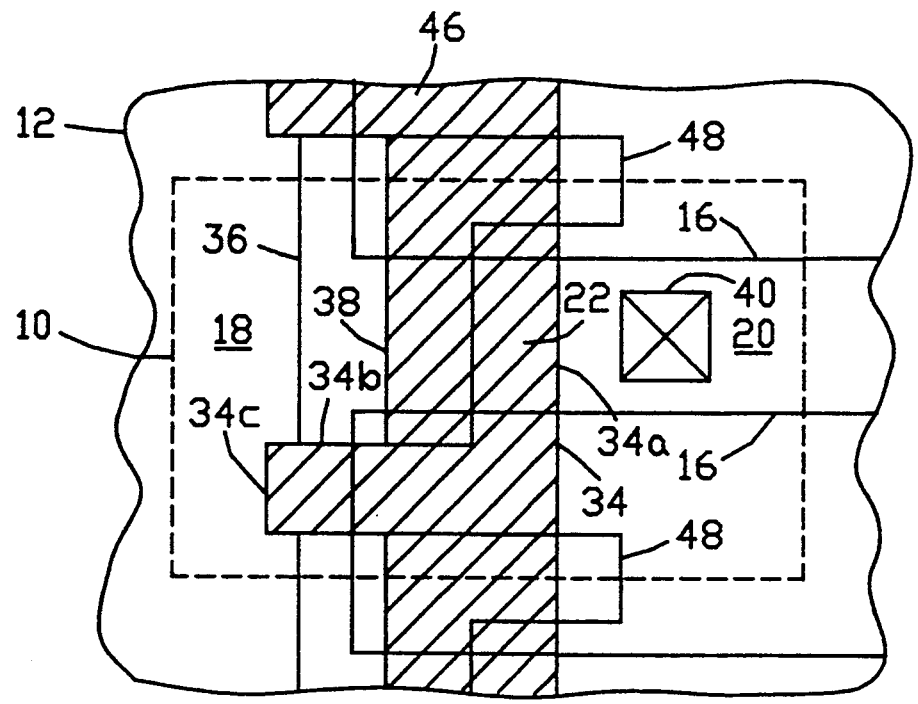
FIG. 4 is similar to FIG. 1 but has a polysilicon control gate (word line) highlighted by diagonal hatching.

FIG. 4 is similar to FIG. 1, but illustrates the control gate 38 highlighted by diagonal hatching. The control gate 38 constitutes a portion of a continuous "word line" 46 which interconnects the control gate 38 of the cell 10 with the control gates of the other cells in the vertical direction as viewed in FIGS. 1 and 4 to 7.

Figure 5:
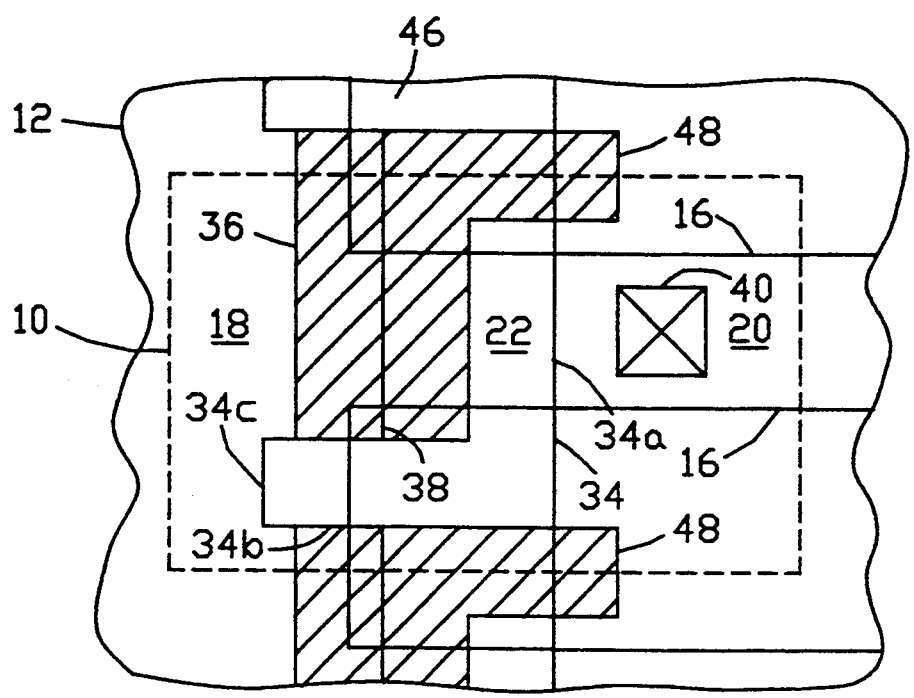
FIG. 5 is also similar to FIG. 1 but has floating polysilicon openings highlighted by diagonal hatching.

FIG. 5 highlights an opening 48 which is cut in the floating polysilicon layer which forms the floating gate 34 to isolate the floating gate 34 from the floating gates of adjacent cells in the vertical direction. The opening 48 is filled with thick oxide during the formation of the gate oxide layer 36.

Figure 6:
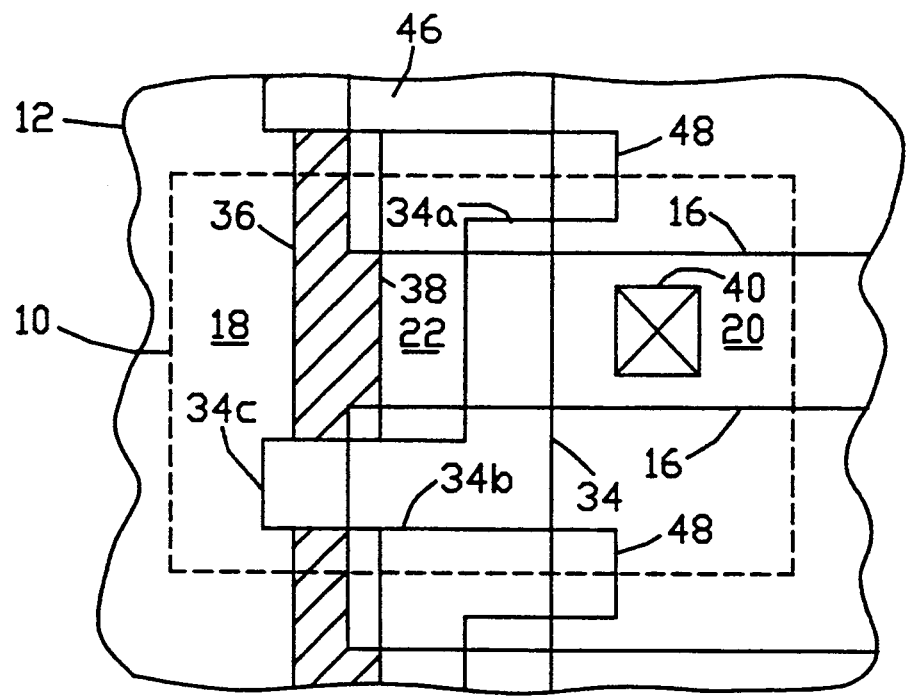
FIG. 6 is also similar to FIG. 1 but has a gate oxide region highlighted by diagonal hatching.
Figure 7:
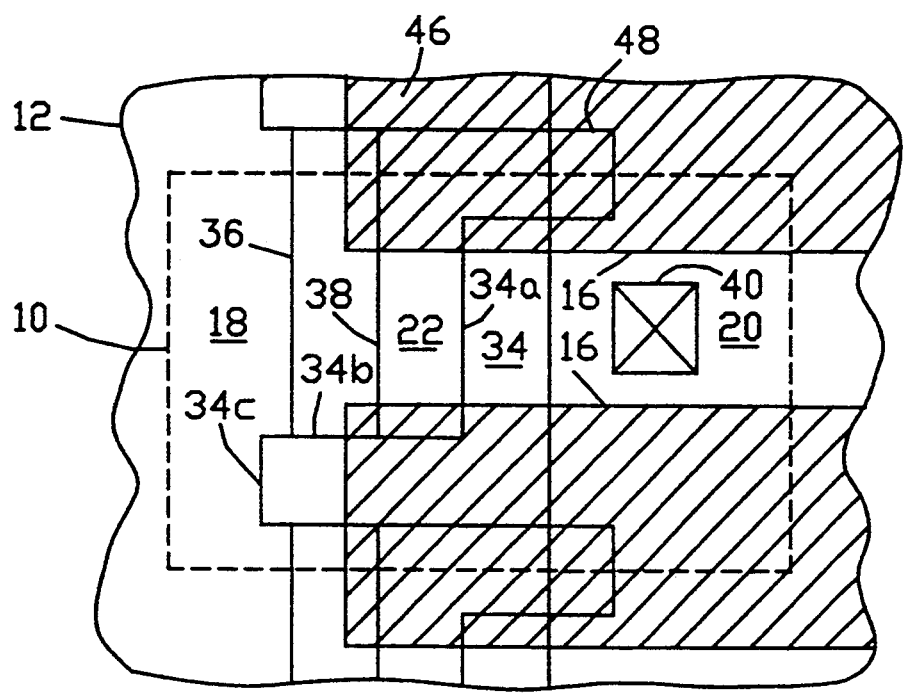
FIG. 7 is also similar to FIG. 1 but has field oxide regions highlighted by diagonal hatching.

FIG. 6 highlights the gate oxide layer 36 which fills the opening 48 and overlies the gap region 22b and the channel 22 at source region. FIG. 7 highlights the insulator 16.

Figure 8:
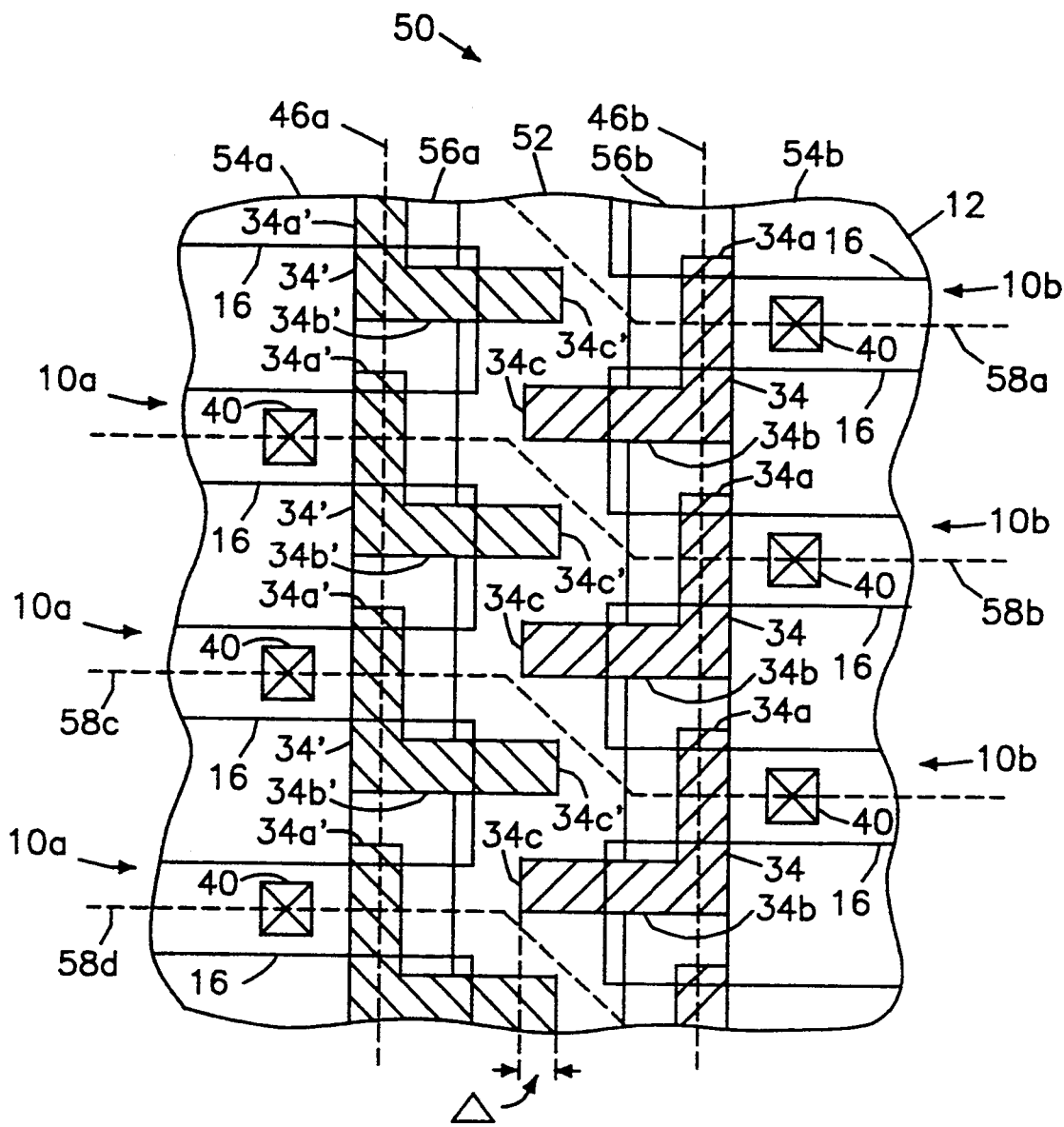
FIG. 8 is a diagram illustrating an EEPROM array embodying the invention which is formed of unit cells as illustrated in FIGS. 1 to 7.

FIG. 8 illustrates an EEPROM array 50 formed of unit cells 10 as illustrated in FIGS. 1 to 7. The array 50 is shown as including two columns of unit cells, although it can be expanded to any size within the scope of the invention. The array 50 includes an elongated common source region 52 which is formed in the substrate 12 and extends in a predetermined direction (vertical as viewed in the drawing). A first drain region 54a and a second drain 54b extend parallel to the source region 52 on opposite sides thereof. A first channel region 56a and a second channel region 56b are formed between the source region 52 and the drain regions 54a and 54b respectively.

A plurality of first unit cells 10a and a plurality of second unit cells 10b are formed on the substrate 12 on the left and right sides of the source region 52 respectively and are vertically spaced from each other. The cells 10b are identical to the cells 10 described with reference to FIGS. 1 to 7. The cells 10a are identical to the cells 10b except that erase sections 34b' of floating gates 34' thereof extend rightwardly, rather than leftwardly as in the cells 10b, from program sections 34a' respectively toward the source region 52.

The cells 10a and 10b include all of the elements of the cell 10. However, only the floating gates 34,34', field oxide insulators 16 and drain contacts 40 are shown for simplicity of illustration. The control gates 38 of the cells 10a and 10b are interconnected by word lines as indicated by broken lines 46a and 46b. The drain contacts of cells 10a and 10b which are adjacent to each other in the horizontal direction are interconnected by "bit lines" indicated by broken lines 58a, 58b, 58c and 58d respectively.

In accordance with the invention, the erase sections 34b' of the cells 10a are vertically staggered from the erase sections 34b of the cells 10b. In addition, the ends of the erase sections 34b' and 34b overlap horizontally by a distance Δ. This arrangement enables the cells 10a and 10b to overlap each other horizontally, and reduce the size of the array 50.

While several illustrative embodiments of the invention have been shown and described, numerous variations and alternate embodiments will occur to those skilled in the art, without departing from the spirit and scope of the invention.

For example, although the flash EEPROM cell as described and illustrated has an N-type channel and the hot charge carriers which are injected into the floating gate are electrons, it is within the scope of the invention to provide a P-channel cell in which the injected hot charge carriers are holes.

Accordingly, it is intended that the present invention not be limited solely to the specifically described illustrative embodiments. Various modifications are contemplated and can be made without departing from the spirit and scope of the invention as defined by the appended claims.

We claim:

1. An electrically erasable programmable read-only memory (EEPROM) cell, comprising:
    a semiconductor substrate;
    a source and a drain formed in the substrate;
    a channel which is formed in the substrate and has a programming region extending from the drain toward the source and a gap region between the source and said programming region;
    a tunnel insulating layer formed over the substrate;
    a floating gate which is formed over the tunnel insulating layer and includes:
        a program section overlying said programming region of the channel; and
        an erase section which extends from said program section and overlaps the source;
    a gate insulating layer formed over said program section of the floating gate and said gap region of the channel; and
    a control gate which is formed over the gate insulating layer and overlies said program and erase sections of the floating gate and said gap region of the channel.

2. A cell as in claim 1, in which said erase section of the floating gate extends from said program section thereof around the channel to the source.

3. A cell as in claim 1, in which said erase section of the floating gate extends from an end of said program section thereof around an end of the channel to the source.

4. A cell as in claim 3, further comprising a field insulator formed in the substrate adjacent to said end of the channel, said erase section of the floating gate extending over said field insulator.

5. A cell as in claim 1, in which the gate insulating layer is thicker than the tunnel insulating layer.

6. A cell as in claim 1, in which the tunnel and gate insulating layers are formed of oxide.

7. An electrically erasable programmable read-only memory (EEPROM) array, comprising:
    a semiconductor substrate;
    an elongated source region which is formed in the substrate and extends in a predetermined direction; and
    a plurality of first cells which are formed on the substrate extending from one side of said source region and are spaced from each other in said predetermined direction; and
    a plurality of second cells which are formed on the substrate extending from an opposite side of said source region and are spaced from each other in said predetermined direction;
    each first and second cell including:
        a source which constitutes a portion of said source region;
        a drain formed in the substrate;
        a channel which is formed in the substrate and has a programing region extending from the drain toward the source and a gap region between the source and said programming region;
        a tunnel insulating layer formed over the substrate;

a floating gate which is formed over the tunnel insulating layer and includes:
  a program section overlying said programming region of the channel; and
  an erase section which extends from said program section and overlaps the source;
a gate insulating layer formed over said program section of the floating gate and said gap region of the channel; and
a control gate which is formed over the gate insulating layer and overlies said program and erase sections of the floating gate and said gap region of the channel; in which
said erase sections of the floating gates of the first cells are staggered from said erase sections of the floating gates of the second cells in said predetermined direction.

8. An array as in claim 7, in which said erase sections of the floating gates of the first cells overlap said erase sections of the floating gates of the second cells perpendicular to said predetermined direction.

9. An array as in claim 7, in which:
said erase section of the floating gate of each first and second cell extends from an end of said program section around an end of the channel respectively to the source region.

10. An array as in claim 9, in which:
each first and second cell further comprises a field insulator formed in the substrate adjacent to said end of the respective channel; and
said erase section of each first and second cell extends over said respective field insulator.

11. An array as in claim 7, in which the gate insulating layer is thicker than the tunnel insulating layer.

12. An array as in claim 7, in which the tunnel and gate insulating layers are formed of oxide.

13. An electrically erasable programmable read-only memory (EEPROM) array, comprising:
a semiconductor substrate;
an elongated source region which is formed in the substrate and extends in a predetermined direction;
a elongated first drain region which is formed in the substrate and extends parallel to said source region on a first side thereof;
an elongated second drain region which is formed in the substrate and extends parallel to said source region on a second side thereof;
an elongated first channel region which is formed in the substrate and extends between said first drain region and said source region;
an elongated second channel region which is formed in the substrate and extends between said second drain region and said source region;
a tunnel insulating layer formed over the substrate;
first field insulators formed in the substrate for dividing said first drain region, said first channel region and said tunnel insulating layer to form a plurality of first cells; and
second field insulators formed in the substrate for dividing said second drain region, said second channel region and said tunnel insulating layer to form a plurality of second cells;
each first cell including:
  a first source which constitutes a portion of said source region;
  a first drain which constitutes a portion of said first drain region;
  a first channel which constitutes a portion of said first channel region and has a first programming region extending from the first drain toward the first source and a gap region between said first programming region and the first source respectively;
  a first floating gate which is formed over the tunnel insulating layer and includes:
    a first program section overlying said first programing region of the first channel respectively; and
    a first erase section which extends from said first program section and overlaps the first source respectively;
  a gate insulating layer formed over said first program section of the first floating gate and said first programming region of the first channel respectively; and
  a first control gate which is formed over the gate insulating layer and overlies said first program and erase sections of the first floating gate and said gap region of the first channel respectively;
each second cell including:
  a second source which constitutes a portion of said source region;
  a second drain which constitutes a portion of said second drain region;
  a second channel which constitutes a portion of said second channel region and has a second programming region extending from the second drain toward the second source and a gap region between said first programming region and the first source respectively;
  a second floating gate which is formed over the tunnel insulating layer and includes:
    a second program section overlying said second programing region of the second channel respectively; and
    a second erase section which extends from said second program section and overlaps the second source respectively;
  the gate insulating layer being further formed over said second program section of the second floating gate and said second programing region of the second channel respectively; and
  a second control gate which is formed over the gate insulating layer and overlies said second program and erase sections of the second floating gate and said gap region of the second channel respectively; in which
said first erase sections are staggered relative to said second erase sections in said predetermined direction.

14. An array as in claim 13, in which said first erase sections overlap said second erase sections perpendicular to said predetermined direction.

* * * * *